United States Patent [19]

Klun et al.

[11] Patent Number: 5,227,008

[45] Date of Patent: Jul. 13, 1993

[54] METHOD FOR MAKING FLEXIBLE CIRCUITS

[75] Inventors: Thomas P. Klun, Lakeland, Minn.; Thach G. Truong, Austin, Tex.

[73] Assignee: Minnesota Mining and Manufacturing Company, St. Paul, Minn.

[21] Appl. No.: 823,899

[22] Filed: Jan. 23, 1992

[51] Int. Cl.$^5$ .................. B44C 1/22; C23F 1/00; B29C 37/00

[52] U.S. Cl. .................. 156/630; 156/634; 156/655; 156/656; 156/659.1; 156/661.1; 156/668; 156/666; 156/902; 252/79.5; 428/209

[58] Field of Search ........... 156/630, 634, 655, 656, 156/659.1, 661.1, 668, 666, 902; 252/79.1, 79.5; 430/313, 314, 315, 316, 318, 319; 428/195, 209, 458, 473.5, 901

[56] References Cited

U.S. PATENT DOCUMENTS

| | | | |
|---|---|---|---|
| 3,395,057 | 7/1968 | Fick | 156/3 |
| 3,448,098 | 6/1969 | Gaines et al. | 260/211.5 |
| 3,469,982 | 9/1969 | Celeste | 96/35.1 |
| 3,526,504 | 9/1970 | Celeste | 96/35.1 |
| 3,867,153 | 2/1975 | MacLachlan | 96/79 |
| 3,871,930 | 3/1975 | Fish | 156/3 |
| 4,039,371 | 8/1977 | Brunner et al. | 156/668 |
| 4,846,929 | 7/1989 | Bard et al. | 156/630 |
| 4,857,143 | 8/1989 | Glenning et al. | 156/668 |
| 4,911,786 | 3/1990 | Kindl et al. | 156/659 |
| 4,986,880 | 1/1991 | Dorfman | 156/685 |

FOREIGN PATENT DOCUMENTS

3919249A1 12/1990 Fed. Rep. of Germany .

Primary Examiner—William A. Powell
Attorney, Agent, or Firm—Gary L. Griswold; Walter N. Kirn; Darla P. Neaveill

[57] ABSTRACT

A process for making flexible circuits wherein the etching of a polymeric film is accomplished by dissolving portions thereof with concentrated aqueous base using an aqueous processible crosslinked photoresist as a mask, comprising the steps of laminating the resist on a polymeric film, exposing a pattern into the resist, developing the resist with a dilute aqueous solution until desired image is obtained, etching portions of the polymeric film not covered by the crosslinked resist with a concentrated base at a temperature of from about 50° C. to about 120° C., and then stripping the resist off the polymeric film.

16 Claims, No Drawings

METHOD FOR MAKING FLEXIBLE CIRCUITS

BACKGROUND OF THE INVENTION

1. Field of the Invention

The invention provides a process for making flexible circuits comprising the step of etching polymer films by masking portions thereof with crosslinked negative aqueous processible photoresists and dissolving unmasked portions thereof with concentrated aqueous base.

2. Description of the Related Art

A typical step in the fabrication of electronic circuitry on polymeric carrier films is to etch through the polymeric film to allow for subsequent connection through the backside to other devices or, where applicable, connection of frontside and backside circuitry. The selective etching or milling is necessary to allow electrical connections to be made between the differing conductive layers. Those portions of the polymeric film for which etching is not desired must be masked with a protective coating. The masking process can be satisfactorily done with the art of photolithography whereby an etch-insensitive material is applied and patterned using normal lithographic methods, i.e., exposure and development.

Solvent processible, water-insoluble or water-insensitive photoresists are ideal for masking where the subsequent etching process is aqueous based. Solvent processible resists are both developed and stripped using solvents and remain intact during such a process and thus protect any covered areas of the polymeric film while allowing etching of areas not protected by resists. However, solvent processible resists are less desirable from environmental and economic perspectives, and thus aqueous processible resists are preferred.

However, aqueous processible resists are stripped using dilute bases. Therefore, they have not been used as masks in processes involving aqueous base chemical etching of polymers.

U.S. Pat. No. 4,039,371 discloses a composition for etching polyimide based polymers comprising a tetraalkyl ammonium hydroxide and acetic acid, tartaric acid or oxalic acid. The resists disclosed to be useful as masks are positive resists; those resists specifically mentioned are all solvent processible and coated by spincoating techniques.

U.S. Pat. No. 3,871,930 discloses the use of a commercial solvent processible photomask for use with an etching solution comprising a suitable base in a nonaqueous solvent such as dimethylsulfoxide.

U.S. Pat. No. 3,395,057 discloses the use of solvent processible photoresists and copper foils to mask those areas not to be etched.

U.S. Pat. No. 4,857,143 discloses a process for etching a fully or substantially fully cured polyimide layer which comprises contacting such layer with an aqueous solution at least about 3 molar of a metal hydroxide and at least about 0.5 molar of a metal carbonate, metal sulfate or metal phosphate. It is specifically disclosed that copper is used as the etching mask for the polyimide film.

It has now been discovered that the etching step may be done with hot, concentrated, e.g., 35% potassium hydroxide, using a crosslinked aqueous processible photoresist as a mask.

Surprisingly, the crosslinked photoresist protects the masked area such that etching of the polymer film is completed only where desired without significantly swelling or delaminating the photoresist. This is especially surprising when it is considered that the aqueous photoresists will delaminate from the film when exposed to dilute basic solutions, e.g., 5% or less. This process avoids use of a solvent processible resist, while also eliminating processing steps and the need for copper masks.

SUMMARY OF THE INVENTION

The invention provides a process for etching a fully cured or substantially fully cured polymeric film which comprises contacting said polymeric film with a concentrated base at a temperature of from about 50° C. to about 120° C., wherein portions of said polymeric film are protected with a mask comprising a crosslinked negative aqueous processible photoresist, the photoresist exhibiting substantially no swelling or delamination from said polymeric film during the etching.

The invention further provides a process for making flexible circuits wherein the step of etching of a polymeric film is accomplished by dissolving portions thereof with concentrated aqueous base, using a crosslinked negative aqueous processible photoresist as an etching mask, comprising the steps of a) laminating said photoresist on a polymeric film, b) exposing at least a portion of said photoresist, thereby crosslinking said exposed portions thereof, c) developing said photoresist with a dilute aqueous solution until desired image is obtained, d) etching portions of the polymeric film not covered by the crosslinked photoresist with a concentrated base at a temperature of from about 50° C. to about 120° C., e) stripping said crosslinked photoresist off said polymeric film with a dilute aqueous basic solution.

The invention also provides a preferred process wherein the concentrated aqueous base used to etch the polymeric film is 35% or stronger potassium hydroxide.

As used herein the terms "resist" and "photoresist" are synonymous and interchangeable. Also, the terms "pattern" and "image" are used interchangeably to mean the configuration which is formed by the exposure and development of a photoresist.

DETAILED DESCRIPTION OF THE INVENTION

The processes of the present invention are concerned with the etching of substantially fully cured polymeric films, including such films as polyester, e.g., poly(ethylene terephthalate), polycarbonates, and polyimide. Polyimides are preferred polymeric films, including unmodified polyimides as well as modified polyimides such as polyester imides, polyimide-imide-esters, polyamide-imides, polysiloxane-imides, and other mixed imides. Especially preferred is a polyimide polymer made from the anhydride of pyromelittic acid and 4,4 diamino-diphenyl ether represented by the general formula:

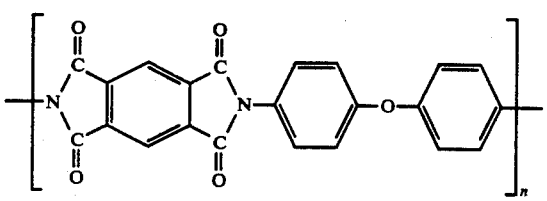

wherein n ranges from about 150 to about 650, available from E. I. DuPont de Nemours and Company, (DuPont), under the tradename Kapton ™, e.g., Kapton ™ V, Kapton ™ E and Kapton ™ H, and also available from Kaneka Chemical Industries under the trade name Apical ™. Other commercially available polyimide precursors include those available from DuPont under the trade name Pyralin ™.

Negative photoresists useful in processes of the invention include negative aqueous processible polymerizable photohardenable compositions such as those disclosed in U.S. Pat. Nos. 3,469,982, 3,448,098, 3,867,153, and 3,526,504, all of which are incorporated herein by reference.

Such photoresists include at least one polymer, additional crosslinkable monomeric units and a photoinitiator. Examples of polymers used in photoresists include copolymers of methylmethacrylate, ethyl acrylate and acrylic acid, copolymers of styrene and maleic anhydride isobutyl ester and the like. The crosslinkable monomeric units may be multiacrylates such as trimethylol propane triacrylate.

Examples of some aqueous processible negative photoresists employed according to the present invention are from polymethyl-methacrylates such as those commercially available from DuPont under the trade name "Riston", e.g., Riston 4720.

Also useful are those available from Hercules under the tradename Aquamer ™, e.g., the "SF" and "CF" series resists, such as SF120, SF125 and Aquamer ™ CF 2.0; those available from LeaRonal as "AP850", and those available from Hitachi as "Photec HU350".

Useful etchants are concentrated bases which are water soluble including, but not limited to, potassium hydroxide, sodium hydroxide, and cesium hydroxide. Bases with low water solubility such as lithium hydroxide, aluminum hydroxide, and calcium hydroxide are not useful in processes of the invention as the solution becomes saturated prior to reaching useful concentrations.

The useful concentration of the etchant varies with the specific selection thereof, the thickness of the polymeric film to be etched, as well as the type and thickness of the photoresist chosen. Typical useful concentrations range from about 25% to about 60% by weight, preferably from about 35% to about 50%. In one highly preferred embodiment, potassium hydroxide having a concentration of from about 39% to about 45% is used. In an alternative embodiment, sodium hydroxide is used at a concentration of from about 25% to about 60% by weight.

The etching step of the process of the present invention is accomplished by contacting unmasked areas of the polymeric film with the concentrated base etchant.

The time for etching depends upon the type and thickness of the film to be etched and is typically from about 10 seconds to about 20 minutes. When the preferred etchant, concentrated KOH, is used, the etching time for a 50 micrometer (2 mil) polyimide film is from about 30 seconds to about 180 seconds. The etching solution is generally at a temperature of from about 50° C. (122° F.) to about 120° C. (250° F.).

The process of making flexible circuits according to the invention comprises the step of etching which may be used in conjunction with various known pre-etching and post-etching procedures. The sequence of such procedures may be varied as desired for the particular application.

A typical sequence of steps may be described as follows:

The aqueous processible photoresists are laminated onto both sides of a substrate having a polymeric film side and a copper side, using standard laminating techniques. Typically, the substrate consists of a polymeric film layer of from about 25 micrometers to about 125 micrometers, with the copper layer being from about 1 to about 5 micrometers thick. The substrate may be made by various methods such as adhesively bonding a polyimide layer onto copper foil, coating liquid polyimide on copper foil or the like.

The thickness of the photoresist is from about 35 to about 50 micrometers. The photoresist is then exposed on both sides to ultraviolet light or the like, through a mask, crosslinking the exposed portions of the resist. The resist is then developed with a dilute aqueous solution, e.g., a 0.5–1.5% carbonate solution, until desired patterns are obtained on both sides of the laminate. The copper side of the laminate is then further plated to desired thickness. The laminate is then placed into a bath of concentrated base at a temperature of from about 50° C. to about 120° C. which etches the portions of the polymeric film not covered by the crosslinked resist. This exposes certain areas of the original thin copper layer. The resist is then stripped off both sides of the laminate in a 2–5% solution of an alkaline metal hydroxide at from about 20° C. to about 80° C., preferably from about 20° C. to about 60° C. Subsequently, the original thin copper layer is etched where exposed with an etchant which does not harm the polymeric film, e.g., Perma-etch, available from Electrochemicals, Inc.

In an alternate process, the aqueous processible photoresists are laminated onto both sides of a substrate having a polymeric film side and a copper side, using standard laminating techniques. The substrate consists of a polymeric film layer about 12 micrometers to about 125 micrometers thick with the copper layer being from about 12 to about 40 micrometers thick. The photoresist is then exposed on both sides to ultraviolet light or the like, through a suitable mask, crosslinking the exposed portions of the resist. The image is then developed with a dilute aqueous solution until desired patterns are obtained on both sides of the laminate. The copper layer is then etched to obtain circuitry, and portions of the polymeric layer thus exposed. An additional layer of aqueous photoresist is then laminated over the first resist on the copper side and crosslinked by flood exposure to a radiation source in order to protect exposed polymeric film surface (on the copper side) from further etching. Areas of the polymeric film (on the film side) not covered by the crosslinked resist are then etched with the concentrated base at a temperature of from about 70° C. to about 120° C., and the photoresists are then stripped from both sides with a dilute basic solution.

Other steps may also be included, such as soaking the film in hot water before or after the etching bath. Acid baths may also be used as a post-etching neutralization.

To create finished products such as flexible circuits, interconnect bonding tape for "TAB" (tape automated bonding) processes, microflex circuits, and the like, further layers may be added and processed, the copper plating may be plated with gold, tin, or nickel for subsequent soldering procedures and the like according to conventional means.

The following examples are meant to be illustrative and are not intended to limit the scope of the invention which is expressed solely by the claims.

EXAMPLES

Example 1

Two layers of 50 micron thick aqueous resists, available from DuPont under the tradename Riston TM 4720, were laminated with heated rubber rolls to a flexible substrate consisting of 50 microns of Kapton TM H polyimide on one side and copper on the other. The laminate was then exposed with ultraviolet (UV) light through a phototool on each side and developed with 0.75% aqueous solution of sodium carbonate on both sides to obtain desired image of circuitry. Copper was then plated on the copper side of the laminate to 35 microns in thickness. The polyimide side was then etched in a conveyorized machine having a KOH module with 4 spray bars with flat jet nozzles using 43% to 47% KOH at 75° C. to 95° C. for about 3 to 7 minutes. There was no significant swelling of the resist mask nor any stripping of the resist from the polyimide surface.

The resists on both sides were then stripped from the laminate with 3-4% KOH for 1 to 2 minutes at 60° C. The resists swelled and delaminated from the copper and polyimide surfaces cleanly. The circuitry was then produced by etching the initial copper layer with Perma-Etch, available from Electrochemicals, Inc.

Example 2

A circuit was produced in the same method as example 1 except that the aqueous photoresist used was available from Hercules under the tradename Aquamer TM SF-120. After etching, there was no significant swelling of the resist mask nor any stripping of the resist from the polyimide surface.

Example 3

A circuit was produced in the same method as example 1 except that the aqueous photoresist used was available from LeaRonal under the tradename Ordyl TM AP850. After etching, there was no significant swelling of the resist mask nor any stripping of the resist from the polyimide surface.

Example 4

Two layers of 50 micron thick experimental aqueous processible resists from Hercules designated "pSD-1720", were laminated with heated rubber rolls to a flexible substrate available from Nippon Steel Chemical, Inc. under the trade name Expanex TM. The substrate consists of a 25 micron thick layer of polyimide on one side and a 25 micron thick copper layer on the other. The laminate was then exposed to ultraviolet light through a phototool on each side and developed on both sides with a 0.75% aqueous sodium carbonate solution to obtain the desired circuitry image. The copper layer was then etched with ferric chloride to obtain circuitry on the copper. Another layer of aqueous processible photoresist was then laminated onto the copper side and flood exposed to protect the now-exposed polyimide areas from subsequent etching. The unmasked areas on the polyimide side were then etched in a beaker at 85° C. to 95° C. with 44% KOH for 15 minutes. There was no significant swelling of the resist masking, nor any stripping of the resist from the polyimide surface. The resist on both sides were then stripped off the laminate with 3-4% KOH for 1-2 minutes at 60° C. The resist swelled and delaminated from the copper and polyimide surfaces cleanly.

Example 5

A circuit was produced in the same method described in Example 4, except that the flexible substrate has an adhesive layer bonding the polyimide and copper layers together.

Example 6

A circuit was produced in the same method as described in Example 1, except that 37% KOH was sprayed for 3 minutes at 85° C. During the etching step, there was no sign of resist swelling or stripping from the polyimide surface.

Comparative Example 7C

Onto the polyimide side of a flexible substrate consisting of a 50 micron thick layer of Kapton TM H with a copper flash plate on one side, was coated the positive aqueous photoresist "AZ-4903", available from Hoechst GmbH. The resist was coated at 120-125 micron wet thickness, and then dried for 30 minutes at 90° C. The resist was then exposed to 1000 mj/cm$^2$ of UV radiation, developed in 0.2N KOH, and baked for 30 minutes at 90° C. The laminate was then dipped into 43-45% KOH at 88° C. About 70% of the photoresist dissolved, and the base began to attack the polyimide. When the laminate was removed from the basic bath and placed into 150° F. water, the photoresist completely dissolved and there was no pattern of the circuit visible.

Examples 8-17

Circuits were produced in the same manner as described in Example 1, except that each circuit was etched by dipping into a beaker with hot KOH, i.e., a bath of from 88° C. to about 93° C. for 90 seconds. The concentrations of the KOH were 35%, 38%, 41%, 44%, 46%, 49%, 51%, 54%, 56% and 59%, respectively. Each resist was then washed with water, and the resist was stripped with 3%-4% KOH at room temperature. The etched thicknesses were then measured, and all were satisfactory. There was no significant swelling of any of the resists, nor any stripping of any of the resists from the polyimide surfaces in the etching solution.

Examples 18-29

Circuits were produced in the same manner described in Example 11, except that each circuit was etched by dipping into a beaker containing hot NaOH, i.e., a bath of from 88° C. to about 93° C., for 300 seconds at varying concentrations. The concentrations of NaOH used were 26%, 29%, 32%, 35%, 38%, 42%, 44%, 47%, 50%, 53%, 56%, and 59% respectively. Again, there was no significant swelling of any of the resists, nor any stripping of any of the resists from the polyimide surfaces in the etching solution.

Examples 30-32

Circuits were produced in the same manner described in Example 1, except that each circuit was etched by dipping into a beaker containing hot CsOH, i.e., a bath of from 88° C. to about 93° C., for 60 seconds at varying concentrations. The concentrations of CsOH used were 47%, 64%, and 70%, respectively. Again, there was no significant swelling of any of the resists, nor any stripping of any of the resists from the polyimide surfaces in the etching solution.

Examples 33C–34C

Circuits were produced in the same manner as described in Example 1, except that each circuit was dipped into a beaker with hot LiOH, i.e., a bath of from 99° C. to about 104° C. The concentrations of the LiOH were 10% and 11% respectively. Higher concentrations could not be achieved as the solution was saturated. After about 55 seconds, the resists became discolored, and lifted from polyimide surfaces. They were then removed and washed with water. There was no significant etching or stripping of the resists from the polyimide surfaces. This base was not considered useful for processes of the invention because of the low solubility of the chemical in hot water.

Example 35C

A circuit was produced the same method as described in Example 1. A solution of $Ca(OH)_2$ was prepared in a beaker, but the low solubility of the chemical in hot water rendered it useless for etching of polyimide.

Example 36C

A circuit was produced the same method as described in Example 1. A solution of $Al(OH)_3$ was prepared in a beaker, but the low solubility of the chemical in hot water rendered it useless for etching of polyimide.

Examples 37–44

Circuits were prepared in the same method as described in Example 1, except that the circuits were etched by dipping into a beaker containing a mixture of KOH and urea at 43° C. to 49° C. for from 60 to 300 seconds. The varying concentrations of the mixtures, and the time each circuit remained in the mixture are listed in Table 1. The resists were then washed with water and stripped with 3–4% KOH at room temperature. There was no significant swelling of the resists nor any stripping of the resists from the polyimide surfaces in the etching solution.

TABLE 1

| EX | Urea Conc. % | KOH Conc. % | Time Min. | Resist Condition |
|---|---|---|---|---|
| 37 | 24% | 27.5% | 15 | resist intact |
| 38 | 23.1% | 29.7% | 15 | resist intact |
| 39 | 22.2% | 31.6% | 15 | resist intact |
| 40 | 21.4% | 34% | 15 | resist intact |
| 41 | 20.7% | 35.8% | 15 | resist intact |
| 42 | 20% | 37.6% | 15 | resist intact |
| 43 | 19.4% | 39.1% | 15 | resist intact |
| 44 | 19.4% | 39.1% | 1* | *at 190° F., resist intact, solution is boiling |

Each etched thickness was then examined, and found to be satisfactory. There was no significant swelling of the resists nor any stripping of the resists from the polyimide surfaces in etching solution.

Examples 45–48

Circuits were prepared in the same method as described in Example 1, except that the circuits were etched by dipping into a beaker containing a mixture of KOH and $K_2CO_3$ at 88° C. to 93° C. for 300 seconds. The varying concentrations of the mixtures, and the time each circuit remained in the mixture are listed in Table 2. The resists were then washed with water and stripped with 3–4% KOH at room temperature.

TABLE 2

| EX | KOH Conc. % WT | $K_2CO_3$ Conc. % WT | Resist Condition |
|---|---|---|---|
| 45 | 35.6% | 13.0% | resist intact |
| 46 | 32.8% | 20.0% | resist intact |
| 47 | 30.4% | 25.9% | resist intact |
| 48 | 28.3% | 31.0% | resist intact |

Each etched thickness was then examined, and found to be satisfactory. There was no significant swelling of the resists nor any stripping of the resists from the polyimide surfaces in etching solution.

Examples 49–50

Circuits were prepared in the same method as described in Example 1, except that the circuits were etched by dipping into a beaker containing a mixture of KOH and $Na_2CO_3$ at 88° C. to 93° C. for 300 seconds. The varying concentrations of the mixtures, and the time each circuit remained in the mixture are listed in Table 3. The resists were then washed with water and stripped with 3–4% KOH at room temperature.

TABLE 3

| EX | KOH Conc. % WT | $Na_2CO_3$ Conc. % WT | Resist Condition |
|---|---|---|---|
| 49 | 35.6% | 9.1% | resist intact |
| 50 | 32.8% | 10.23% | resist intact |

Each etched thickness was then examined, and found to be satisfactory. There was no significant swelling of the resists nor any stripping of the resists from the polyimide surfaces in etching solution.

Example 51

A circuit was produced in the same manner as described in Example 1, except that the flexible substrate was poly(ethylene terephthalate). The circuit was etched by dipping into a beaker with hot 46% KOH, i.e., a bath of from 88° C. to about 93° C. for 30 minutes. The resist was then washed with water and stripped with 3–4% KOH at room temperature. The etched thickness was then examined, and found to be satisfactory. There was no significant swelling of the resist nor any stripping of the resist from the polyimide surface in etching solution.

Example 52

A circuit was produced in the same manner as described in Example 1, except that the flexible substrate was polycarbonate film, available from Mobay Corporation under the trade name Markrofol TM. The circuit was etched by dipping into a beaker with hot 45% KOH, i.e., a bath of from 88° C. to about 93° C. for 20 minutes. The resist was then washed with water and stripped with 3–4% KOH at room temperature. The etched thickness was then examined, and found to be satisfactory. There was no significant swelling of the resist nor any stripping of the resist from the polyimide surface in etching solution.

Example 53

A circuit was produced in the same method as example 1 except that the aqueous photoresist used was available from Hitachi under the tradename Photac ™ HU350. After etching, there was no significant swelling of the resist mask nor any stripping of the resist from the polyimide surface.

What is claimed is:

1. A process for etching a fully cured or substantially fully cured polymeric film which comprises contacting said polymeric film with a concentrated base at a temperature of from about 50° C. to about 120° C., wherein portions of said polymeric film are protected with a mask comprising a crosslinked negative aqueous processible photoresist, said photoresist exhibiting substantially no swelling or delamination from said polymeric film during said etching.

2. A process for making a flexible printed circuit according to claim 1 wherein the step of etching of a polymeric film is accomplished by dissolving portions thereof with concentrated aqueous base using a crosslinked negative aqueous processible photoresist as a mask, comprising the steps of
   a) laminating said resist on a flexible substrate comprising a polymeric film,
   b) exposing at least a portion of said resist thereby crosslinking said exposed portions thereof,
   c) developing said resist with a dilute aqueous solution until desired patterns are obtained,
   d) etching portions of the polymeric film not covered by the crosslinked resist with a concentrated base at a temperature of from about 70° C. to about 120° C.,
   e) stripping said resist off said polymeric film with dilute basic solution.

3. A process for making a flexible printed circuit wherein etching of a polymeric film is accomplished by dissolving portions thereof with concentrated aqueous base, using a crosslinked negative aqueous processible photoresist as a mask, comprising the steps of
   a) laminating said resist on a flexible substrate comprising a layer of polymeric film and a thin layer of copper,
   b) exposing at least a portion of said resist thereby crosslinking said exposed portions,
   c) developing said resist with a dilute aqueous solution until desired patterns are obtained,
   d) plating circuitry atop said thin copper layer to desired thickness,
   e) etching portions of said polymeric film not covered by the crosslinked resist with a concentrated base at a temperature of from about 70° C. to about 120° C.,
   f) stripping said resist off said polymeric film with dilute basic solution, and
   g) etching said thin copper layer to obtain circuitry.

4. A process for making a flexible circuit wherein etching of a polymeric film is accomplished by dissolving portions thereof with concentrated aqueous base using a crosslinked negative aqueous processible photoresist as a mask, comprising the steps of
   a) laminating said resist at a flexible substrate which consists of a layer of polymeric film and a thick layer of copper,
   b) exposing at least a portion of said resist thereby crosslinking said exposed portions thereof,
   c) developing said resist with a dilute aqueous solution until desired patterns are obtained,
   d) etching said thick copper layer to obtain circuitry, thus exposing areas of said polymeric film,
   e) laminating an additional layer of photoresist over said copper layer, and flood exposing said resist, to crosslink said resist in order to protect exposed areas of polymeric film from etching,
   f) etching portions of said polymeric film not covered by the crosslinked resist with a concentrated base at a temperature of from about 70° C. to about 120° C., and
   g) stripping said resist with dilute basic solution.

5. A process according to claim 1 wherein said concentrated base is selected from the group consisting of potassium hydroxide, sodium hydroxide, and cesium hydroxide.

6. A process according to claim 5 wherein said concentrated base is a mixture further comprising at least one member selected from the group consisting of urea, sodium carbonate, potassium carbonate, calcium carbonate, and mixtures thereof.

7. A process according to claim 5 wherein said concentrated base is potassium hydroxide having a concentration of from about 35% to about 60% by weight.

8. A process according to claim 5 wherein said concentrated base is sodium hydroxide having a concentration of from about 25% to about 60% by weight.

9. A process according to claim 1 wherein said polymeric film is selected from the group consisting of polyimides, polycarbonates, modified polyimides, and polyesters.

10. A process according to claim 4 further comprising a layer of adhesive between said polyimide film layer and said copper layer.

11. A process according to claim 1 wherein said base remains in contact with said resist for from about 30 seconds to about 30 minutes.

12. A process according to claim 11 wherein said base remains in contact with said resist for from about 30 seconds to about 5 minutes.

13. A process according to claim 3 wherein said thin copper side has a thickness of from about 1 micrometer to about 5 micrometers.

14. A process according to claim 4 wherein said thick copper side has a thickness of from about 12 to about 40 micrometers.

15. A process according to claim 1 wherein said crosslinked negative aqueous photoresist is coated onto polymeric film as a liquid.

16. A process according to claim 1 wherein a dry layer of said crosslinked negative aqueous photoresist is laminated onto said polymeric film.

* * * * *